United States Patent [19]

Sherwin et al.

[11] Patent Number: 4,679,002
[45] Date of Patent: Jul. 7, 1987

[54] ELECTROMAGNETICALLY SHIELDED NARROW BAND ELECTROENCEPHALOGRAPHIC AMPLIFIER

[75] Inventors: Gary W. Sherwin, South Huntingdon Township, Westmoreland County; John M. Zomp, North Huntingdon, both of Pa.

[73] Assignee: Westinghouse Electric Corp., Pittsburgh, Pa.

[21] Appl. No.: 727,056

[22] Filed: Apr. 25, 1985

[51] Int. Cl.[4] .............................. H03F 1/00; A61B 5/04
[52] U.S. Cl. ................................... 330/66; 128/731; 330/68; 330/69; 330/260; 330/306
[58] Field of Search ...................... 330/66, 68, 69, 252, 330/260, 306; 128/731

[56] References Cited

U.S. PATENT DOCUMENTS 3,901,215  8/1975  John ................................... 128/731
4,202,354  5/1980  Smith et al. ........................ 128/731
4,350,164  9/1982  Allain, Jr. .......................... 128/731

OTHER PUBLICATIONS

Smith et al., "Portable Device For Detection of Petit Mal Epilepsy", *IEEE Transactions on Biomedical Engineering*, vol. BME-26, No. 8, Aug. 1979, pp. 445-450.

Primary Examiner—James B. Mullins
Attorney, Agent, or Firm—Daniel C. Abeles

[57] ABSTRACT

A low noise, high gain differential amplifier suitable for EEG amplification is constructed in a shielded metal enclosure, preferably on a ground plane circuit board. The amplifier is battery powered to eliminate all possibility of noise from the power system. The amplifier utilizes a pair of operational amplifiers to provide high input impedance for each of two input signals. A differential amplifier generates an internal signal which is filtered and amplified by a pair of bandpass amplifiers and overlapping low pass and high pass amplifiers.

10 Claims, 2 Drawing Figures

ELECTROMAGNETICALLY SHIELDED NARROW BAND ELECTROENCEPHALOGRAPHIC AMPLIFIER

CROSS REFERENCE TO RELATED APPLICATIONS

This application is related to the following concurrently filed copending U.S. patent applications, all assigned to the assignee of the present invention: Electroencephalographic (EEG) Cap by Sherwin having U.S. Ser. No. 727,031; Evoked Potential Autorefractometry System by Bernard, Roth, Mohan, Sherwin and Zomp having U.S. Ser. No. 727,032; Low Noise EEG Probe Wiring System by Sherwin having U.S. Ser. No. 727,060; Subcaratinaceous EEG Probe by Sherwin and Mohan; and Shielded, Self-preparing Electrode Suitable For Electroencephalographic Mapping having, U.S. Ser. No. 727,058.

BACKGROUND OF THE INVENTION

1. Field of the Invention

The present invention relates in general to an amplifier for amplifying a pair of signals indicating electrical potential of skin at two locations and more particularly to an electroencephalographic amplifier having a narrow band which is suitable for cortical evoked potential studies which use an input signal that matches the narrow band of the amplifier and to use with an evoked potential autorefractometry system.

2. Description of the Related Art

One type of electroencephalographic (EEG) study utilizes an input signal having a specific frequency which causes a cortical evoked potential that can be measured using EEG probes or electrodes on the scalp of the subject under study. Another type of EEG study relies on the prior identification of a specific frequency, such as alpha wave activity which increases immediately prior to a subject dozing off. Presently, such studies are conducted using an EEG amplifier which is capable of detecting a wide range of frequencies from direct current to several thousand hertz. In order to provide the capability to amplify signals with such a wide range of frequencies, conventional EEG amplifiers utilize chopper stabilization and cost ten to fifteen thousand dollars. However, despite the high cost and elaborate circuitry of such amplifiers, they do not eliminate all noise present in the environment in which they are used. This is particularly a problem in commerical environments when shielding from environmental electrical noise is normally not provided, such as in an optician's offie.

One example of such a conventional EEG amplifier is Model 611 manufactured by Beckman. This amplifier uses chopper stabilization circuitry and provides the flexibility described above. However, many types of EEG studies utilize two or more probes for sensing skin potential of the scalp in addition to a reference lead attached, for example, to an ear lobe. These types of studies display the difference between the potential of the two probes attached to the scalp. In order to perform such studies with conventional amplifiers, such as Beckman Model 611, one of the scalp probes is used as the reference lead and the other scalp probe is connected to the input to the amplifier. As a result, fluctuations in electrical potential sensed by the first scalp probe cause the internal ground of the input portion of the amplifier to fluctuate. As result, input impedance is limited to three to five kilohms.

SUMMARY OF THE INVENTION

An object of the present invention is to provide a low cost, low noise EEG amplifier.

Another object of the present invention is to provide an EEG amplifier which provides true differential amplification.

A further object of the present invention is to provide an EEG amplifier which eliminates virtually all extraneous signals.

Another object of the present invention is to provide an EEG amplifier with high input impedance for use with virtually any type of EEG probe or electrode.

A further object of the present invention is to provide an EEG amplifier suitable for a commercial environment.

Another object of the present invention is to provide an EEG amplifier suitable for an evoked potential autorefractometry system.

The above objects are attained by providing an amplifier comprising an input for receiving first and second input signals indicating electrical potential of skin at two locations and first and second impedance elements for providing a constant impedance to the first and second input signals and for outputting first and second internal signals, the constant impedance provided by each of the first and second impedance elements being substantially equal. A differential amplifier subtracts the first internal signal from the second internal signal to produce a third internal signal which is amplified and filtered by a filter to produce a narrow band output signal. Batteries provide an internal power source for the amplifier which is shielded by a shield from external electrical and magnetic signals.

These objects, together with other objects and advantages which will be subsequently apparent, reside in the details of construction and operation as more fully hereinafter described and claimed, reference being had to the accompanying drawings forming a part hereof, wherein like reference numerals refer to like parts throughout.

DESCRIPTION OF THE PREFERRED EMBODIMENT

Figure 1:
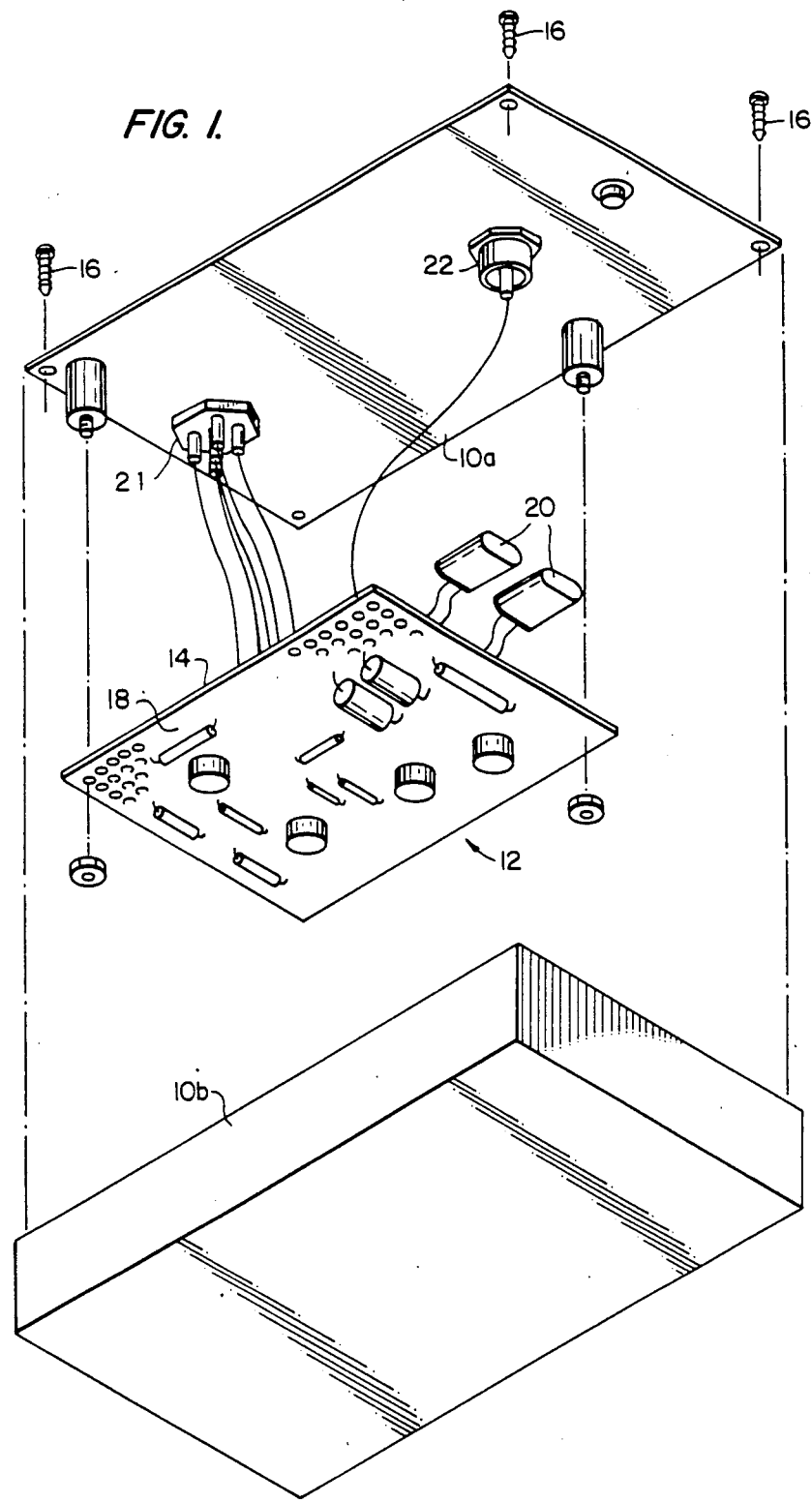
FIG. 1 is an exploded view of an amplifier according to the present invention.

An EEG amplifier according to the present invention is capable of extremely low noise operation due to the physical construction of the amplifier. As illustrated in FIG. 1, a metal enclosure 10 comprises a metal top 10a and a metal bottom 10b which surround all of the electronic components 12 on a circuit board 14 when the top 10a is attached to the bottom 10b by screws 16. The circuit board 14 is a ground plane circuit board which includes a copper film 18 on one side thereof. To eliminate noise from power lines, batteries 20 provide power for the amplifier. An input jack 21 and an output jack 22 are located on the top 10a and connected to the electronic components 12.

Figure 2:
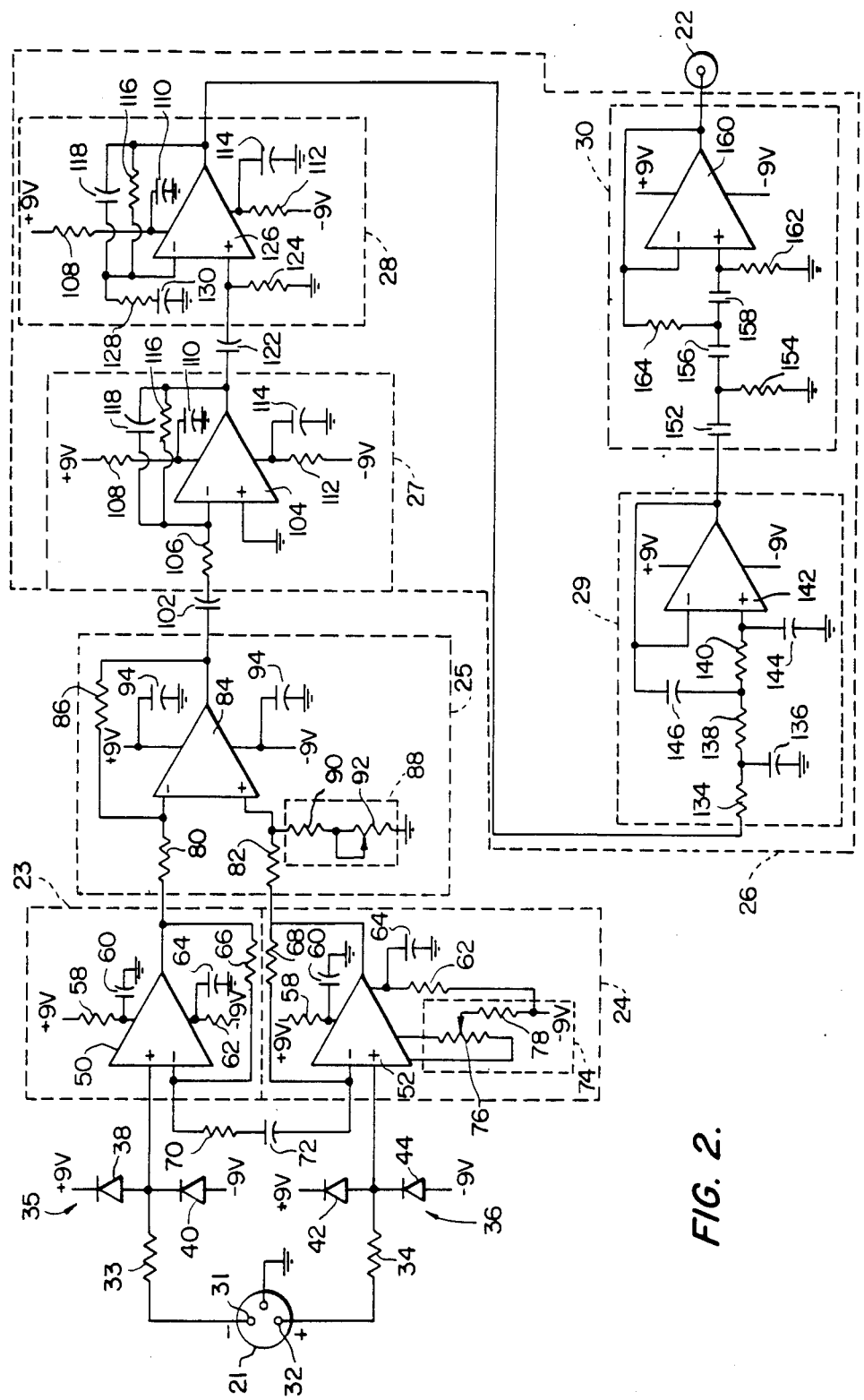
FIG. 2 is a circuit diagram of the electrical components in the amplifier illustrated in FIG. 1.

The connections of the electronic components 12 for one embodiment of an amplifier according to the present invention are illustrated schematically in FIG. 2.

The major electronic components include first 23 and second 24 impedance elements which provide a high input impedance for first and second input signals so that virtually any type of probe or electrode may be used with the amplifier. The output of the impedance elements 23 and 24 are first and second internal signals, respectively. The second internal signal is subtracted from the first internal signal by a differential amplifier 25 which outputs a third internal signal to a filter section 26. The filter section 26 includes a pair of band pass filters 27 and 28 which are designed to have substantially identical center freqencies, band-widths and gains. Following the band pass filters 27 and 28 are overlapping low pass 29 and high pass 30 filters. In FIG. 2, the low pass filter 29 is illustrated as preceeding the high pass filter 30; however, similar results would be obtained if the high pass filter 30 preceeded the low pass filter 29. The first 23 and second 24 impedance elements and differential amplifier 25 preferrably provide little gain, on the order of 10, while the filter section 26 preferably provides gain on the order of $10^6$.

In the embodiment of FIG. 2, the input signals are received by the input jack 21 which includes a first socket 31 and a second socket 32 into which are inserted leads carrying first and second input signals indicating the skin potential of the subject at two different locations. The first and second input signals pass through resistors 33 and 34, respectively, and through clipping diode circuits 35 and 36, respectively. The clipping diode circuits 35 and 36 each comprise two diodes 38 and 40, and 42 and 44, respectively. The clipping diode circuits 35 and 36 prevent voltages of higher than +9 volts plus the forward bias voltage of diodes 38 and 42 and negative voltages of less than −9 volts minus the forward bias voltages of diodes 40 and 44 from reaching operational amplifiers 50 and 52.

The operational amplifiers 50 and 52 are each part of low gain amplifiers which form the impedance elements 23 and 24, respectively. The operational amplifiers 50 and 52 may be OP12 amplifiers manufactured by Burr-Brown. Each of the operationl amplifiers 50 and 52 are supplied with +9 volts from one of the batteries 20 via a 470 ohm resistor 58 and at the same node is connected to a 100/μF capacitor 60 connected to ground. Similarly, the operational amplifiers 50 and 52 receive −9 volts from the other of the batteries 20 via another 470 ohm resistor 62 and at the same node is connected to ground via another 100/μF capacitor 64. A 100 kilohm resistor 66 provides feedback for the first operational amplifier 50 and is connected to another 100 kilohm resistor 68 which provides feedback for operational amplifier 52 via a 20 kilohm resistor 70 and 2/μF capacitor 72.

A direct current offset balancing circuit 74 includes a 100 kilohm potentiometer 76 and a 51 kilohm resistor 78. The direct current offset balancing circuit 74 is set to balance the first and second impedance elements 54 and 56 so that they provide substantially equal impedances.

The first and second operational amplifiers 50 and 52 output first and second internal signals to the low gain, differential amplifier 25 via 10 kilohm resistors 80 and 82, respectively. A third operational amplifier 84 subtracts the first internal signal from the second internal signal to produce the third internal signal. The third internal signal is provided as feedback to the operational amplifier 84 via another 10 kilohm resistor 86. A differential gain balancing circuit 88 is connected to the node of the operational amplifier 84 which receives the second internal signal. The differential gain balancing circuit 88 comprises a 190 kilohm resistor 90 and a 20 kilohm potentiometer 92 connected in series between resistor 82 and ground. The operational amplifier 84 may be an OP5 operational amplifier manufactured by Burr-Brown. The operational amplifier 84 is connected to the batteries 20 to receive +9 volts and −9 volts at nodes which are also connected to ground via 1/μF capacitors 94.

The third internal signal is also supplied to the first bandpass amplifier 27 via a 2/μF isolating capacitor 102 which provides alternating current (AC) coupling and prevents passage of direct current. The bandpass amplifier 27 comprises an operational amplifier 104, such as an OP5, which receives the AC coupled third internal signal via a 24 kilohm resistor 106. The operational amplifier 104 receives positive voltage from the connection between a 470 ohm resistor 108 and a 1/μF capacitor 110 connected in series between ground and the +9 volt terminal of the batteries 20. The operational amplifier 104 receives negative voltage from the junction between a 470 ohm resistor 112 and a 1/μF capacitor 114 connected in series between ground and the −9 volt terminal of the batteries 20. Feedback is provided in the first bandpass amplifier 27 by a 7.5 megohm resistor 116 connected in parallel with a 0.001/μF capacitor 118.

The output of the first bandpass amplifier 27 is provided to the second bandpass amplifier 28 via a second isolating capacitor 122 which also provides alternating current coupling. A 24 kilohm resistor 124 connects the capacitor 122 to ground. The second bandpass amplifier 28 comprises an operational amplifier 126, such as an OP5. The operational amplifier 126 is provided with power via resistors 108 and 112 and capacitors 110 and 114 having the same values and connections as the corresponding resistors and capacitors in the first bandpass amplifier 27. Similarly, feedback is provided in the second bandpass amplifier 28 via a 7.5 megohm resistor 116 and 0.001 /μF capacitor 118 as in the first bandpass amplifier 27. However, the feedback resistor 116 and capacitor 118 are grounded at the input side of the operational amplifier 126 by a 24 kilohm resistor 128 and a 2 /μF capacitor 130.

The output of the second bandpass amplifier 28 is provided to the low pass amplifier 29 at one end of a 243 kilohm resistor 134. The other end of the resistor 134 is connected to ground via 0.001 /μF capacitor 136 and also to another 243 kilohm resistor 138. Resistor 138 is connected in series to yet another 243 kilohm resistor 140. Resistor 140 is connected at one end to one of the inputs of an operational amplifier 142 and to ground via a 0.022 /μF capacitor 144. The other input of operational amplifier 142 directly receives its own output signal as feedback and a 0.033 /μF capacitor 146 supplies the feedback signal to the junction of resistors 138 and 140.

The output of the low pass amplifier 29 is supplied to the high pass amplifier 30 at one end of a 0.22 /μF capacitor 152. The other end of capacitor 152 is connected to ground via a 1.4 kilohm resistor 154 and to another 0.22/μF capacitor 156. Capacitor 156 is also connected to another 0.22/uF capacitor 158 which is connected to an operational amplifier 160 and to ground via a 7.5 kilohm resistor 162. The output of operational amplifier 160 is supplied directly as feedback to one of its inputs and to the junction of capacitors 156 and 158 via a 41 kilohm resistor 164. The output of the high pass amplifier 30 is also supplied to the output jack 22 which is preferably a BNC coaxial cable connector. The operational amplifiers 142 and 160 are preferably each one-half of a CA 3240 manufactured by RCA.

In order to minimize noise, all resistors used in the signal path of the amplifier are preferably metal film resistors. These resistors preferably have 1% error or less so that the filters are as accurate as possible. The potentiometers 76 and 92 are preferably 20 turn carbon film potentiometers for precise adjustments. The input jack 21 preferably has gold contacts and a shield case which is mounted on the top 10a of the metal enclosure 10 to provide a continuous shield.

The components described above are selected so that the first, second and third operational amplifiers 50, 52 and 84, respectively, provide a total gain of approximately ten so that any noise present in the input signals is not greatly amplified. On the other hand, the bandpass amplifiers and low and high pass amplifiers provide a total gain of approximately $10^6$ since the input signals are typically very weak.

The use of batteries 20 not only eliminates the posibility of noise from a power line, but also provides safety for the subject or patient under study. In order to ensure safety during operation, the output jack 22 should only be connected to a medical oscilloscope or other medical equipment which meets the usual requirements of electrical insulation or to an opto-isolated voltage-to-frequency converter or similar electrically isolated equipment.

The components described above, provide a common mode rejection of better than 85 dB in the differential amplifier 35. The potentiometer 92 in the differential gain balancing circuit 88 is set to maximize common mode rejection.

The components described in the bandpass amplifiers 27 and 28 and low pass and high pass amplifiers 29 and 30 filter the third internal signal to output a 6 Hz signal with an attenuation slope of greater than 18 dB per octave. The capacitance and resistance values of the components used in the bandpass filters 27 and 28 have the most critical effect on the filtering of the amplifier, but the overlapping low pass amplifier 27 and high pass amplifier 28 provide an attenuation slope of approximately 18 dB per octave with noncritical components.

While, as described above, an amplifier according to the present invention is capable of being used with virtually any probe or electrode, the amplifier is especially effective when used with components which include shielding for low noise operation. For example, the amplifier described above may be used with the EEG Cap and Low Noise EEG Probe Wiring System in the Evoked Potential Autorefractometry System referred to in the Cross-Reference Section above. In addition, the Shielded, Self-Preparing Electrode Suitable for EEG Mapping can also be used with an amplifier according to the present invention. When used with the above described equipment, shielding is provided for EEG signals from a patient's head until amplified by an amplifier according to the present invention. Thus, the very weak signals which are required to be detected by an evoked potential autorefractometry system can be detected and amplified using the present invention in combination with the above referenced low-noise equipment.

The many features and advantages of the present invention are apparent from the detailed specification, and thus it is intended by the appended claims to cover all such features and advantages of the amplifier which fall within the true spirit and scope of the invention. For example, other resistance and capacitance values may be used to provide filters with different center frequencies as is known in the art. Further, since numerous modifications and changes will readily occur to those skilled in the art, it is not desired to limit the invention to the exact construction and operation illustrated and described, accordingly, all suitable modifications and equivalents may be resorted to, falling within the scope and spirit of the invention.

What is claimed is:

1. An amplifier receiving first and second input signals indicating electrical potential of skin at two locations, said amplifier comprising:
   first and second impedance means, operatively connectable to receive the first and second input signals, respectively, for providing a constant impedance to the first and second input signals and for outputting first and second internal signals, respectively, the constant impedance provided by each of said first and second impedance means being substantially equal;
   differential amplifier means for subtracting the first internal signal from the second internal signal to produce a third internal signal;
   filter means for filtering and amplifying the third internal signal to produce a narrow band output signal;
   internal power source means for providing power to said first and second impedance means, said differential amplifier means and said filter means; and
   shield means for completely surrounding and electromagnetically shielding said first and second impedance means, said differential amplifier means, said filter means and said internal power source means from external electrical and magnetic signals, said shield means commmprising:
      a metal enclosure completely surrounding said first and second impedance means, said differential amplifier means and said filter means; and
      a ground plane circuit board, enclosed by said metal enclosure, for mounting said first and second impedance means, said differential amplifier means and said filter means thereon;
   an input jack, having an electromagnetic shield case mounted on said metal enclosure, operatively connectable to receive the first and second input signals;
   first and second clipping means, mounted on said ground plane circuit board, surrounded by said metal enclosure and operatively connected to said first and second impedance means, respectively, and to said input jack, for clipping the first and second input signals, respectively, at predetermined voltage levels; and
   electromagnetically shielded output means for penetrating said metal enclosure to provide egress for the narrow band output signal.

2. An amplifier as recited in claim 1,
   wherein said first impedance means comprises a first low gain operational amplifier operatively connected to said first clipping means and said differential amplifier means,
   wherein said second impedance means comprises:
      a second low gain operational amplifier operatively connected to said second clipping means and said differential amplifier means; and direct current offset balancing means, operatively connected to said second low gain operational amplifier, for balancing direct current offset voltage in said first and second low gain operational amplifiers, and wherein said filter means comprises:

first and second bandpass filters having first and second center frequencies, respectively, the first and second center frequencies being substantially equal;

first alternating current coupling means for coupling said differential amplifier means and said first bandpass amplifier;

second alternating current coupling means for coupling said first and second bandpass amplifiers;

a low pass amplifier operatively connected to said second bandpass amplifier and said output means; and a high pass amplifier operatively connected to said second bandpass amplifier and said output means and operatively connected in series with said low pass amplifier.

3. An amplifier as recited in claim 1, wherein said shield means further comprises an electromagnetically shielded input signal connector mounted in said metal enclosure and connected to said first and second impedance means.

4. An amplifier receiving first and second input signals indicating electrical potential of skin at two locations, said amplifier comprising:

a first low gain amplifier, operatively connectable to receive the first input signal, for providing a first constant impedance to the first input signal and for outputting a first internal signal;

a second low gain amplifier, operatively connectable to receive the second input signal, for providing a second constant impedance, substantially equal to the first constant impedance, and for outputting a second internal signal;

a third low gain amplifier, operatively connected to said first and second low gain amplifiers, for subtracting the first internal signal from the second internal signal to produce a third internal signal;

a first bandpass amplifier having a first center frequency;

first alternating current coupling means for coupling said third low gain amplifier and said first bandpass amplifier;

a second bandpass amplifier having a second center frequency substantially equal to the first center frequency;

second alternating current coupling means for coupling said first and second bandpass amplifiers;

a low pass amplifier operatively connected to said second bandpass amplifier;

a high pass amplifier operatively connected to said second bandpass amplifier and operatively connected in series with said low pass amplifier;

electromagnetically shielded output means for outputting the third internal signal after amplification by said first and second bandpass amplifiers and said low and high pass amplifiers;

internal power source means for providing a source of power to said first, second and third low gain amplifiers, said first and second bandpass amplifiers and said high and low pass amplifiers using batteries; and shield means, for completely surrounding and electromagnetically shielding said first, second and third low gain amplifiers, said first and second bandpass amplifiers, said first and second alternating current coupling means, said low and high pass amplifiers, said output means and said internal power source means.

5. An amplifier as recited in claim 4, wherein said shield means comprises;

a ground plane circuit board, said first, second and third low gain amplifiers, said first and second bandpass amplifiers, said first and second alternating current coupling means and said low and high pass amplifiers being mounted on said ground plane circuit board; and a metal enclosure completely surrounding said first, second and third low gain amplifiers, said first and second bandpass amplifiers, said first and second alternating current coupling means, said low and high pass amplifiers, said internal power means and said ground plane circuit board.

6. An amplifier as recited in claim 5, wherein said first alternating current coupling means comprises:

a first capacitor operatively connected to said third low gain amplifier; and a first resistor operatively connected to said first capacitor and said first bandpass amplifier, and wherein said second alternating current coupling means comprises:

a second capacitor operatively connected to said first and second bandpass amplifiers; and a second resistor operatively connected to said second capacitor, said second bandpass amplifier and ground.

7. An amplifier as recited in claim 5, wherein said first low gain amplifier comprises a first operational amplifier operatively connectable to receive the first input signal and operatively connected to said third low gain amplifier, and wherein said second low gain amplifier comprises:

a second operational amplifier operatively connectable to receive the second input signal and operatively connected to said third low gain amplifier; and direct current offset balancing means, operatively connected to said second operational amplifier, for balancing direct current offset between the first and second internal signals.

8. An amplifier as recited in claim 5, further comprising:

an input jack, operatively connectable to receive the first and second input signals, having gold contacts and a shield case mounted on said metal enclosure; and first and second resistors, mounted on said ground plane circuit board, operatively connected to said input jack to receive the first and second input signals, respectively; and first and second clipping diode circuits, mounted on said ground plane circuit board, operatively connected to said first and second resistors and said first and second low gain amplifiers, respectively, and to said internal power means.

9. An amplifier as recited in claim 5, wherein said output means comprises a shielded BNC coaxial cable connector mounted on said metal enclosure and operatively connected to one of said low and high pass amplifiers.

10. An amplifier as recited in claim 5, wherein said shield means further comprises an electromagnetically shielded input signal connector mounted in said metal enclosure and connected to said first and second low gain amplifiers.

* * * * *